(12) United States Patent
Kuo et al.

(10) Patent No.: US 8,708,145 B2
(45) Date of Patent: Apr. 29, 2014

(54) PACKAGE CUSHIONING STRUCTURE FOR MODULE

(71) Applicant: Shenzhen China Star Optoelectronics Technology Co., Ltd., Guangdong (CN)

(72) Inventors: Yicheng Kuo, Shenzhen (CN); Shihhsiang Chen, Shenzhen (CN); Gang Yu, Shenzhen (CN); Jiahe Cheng, Shenzhen (CN); Zhilin Zhao, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 27 days.

(21) Appl. No.: 13/702,138

(22) PCT Filed: Oct. 10, 2012

(86) PCT No.: PCT/CN2012/082658
§ 371 (c)(1),
(2), (4) Date: Dec. 5, 2012

(65) Prior Publication Data
US 2014/0076765 A1    Mar. 20, 2014

(30) Foreign Application Priority Data
Sep. 14, 2012   (CN) .......................... 2012 1 0341727

(51) Int. Cl.
*B65D 81/02*   (2006.01)
*B65D 85/42*   (2006.01)
*B65D 85/48*   (2006.01)

(52) U.S. Cl.
USPC ........... 206/454; 206/521; 206/586; 206/585; 206/587; 206/522; 206/593; 206/707; 206/710; 206/711; 410/119; 410/87; 211/41.1; 211/41.14; 211/41.18; 53/472

(58) Field of Classification Search
CPC ........ B65D 81/02; B65D 85/42; B65D 85/48; B65D 25/107; B65D 81/052
USPC ........... 211/41.1, 41.18, 41.14; 206/820, 454, 206/586, 587, 522, 320, 521, 591–594, 710, 206/707, 711, 712, 713; 410/119, 87; 53/472, 170, 475, 246
See application file for complete search history.

(56) References Cited

U.S. PATENT DOCUMENTS 3,098,455 A * 7/1963 McElroy et al. .............. 410/125
3,145,853 A * 8/1964 Langenberg .................. 52/2.11
(Continued)

FOREIGN PATENT DOCUMENTS

CN  2594187 Y   12/2003
JP  2003-205975 A   7/2003
(Continued)

*Primary Examiner* — Mickey Yu
*Assistant Examiner* — Gideon Weinerth
(74) *Attorney, Agent, or Firm* — Andrew C. Cheng

(57) ABSTRACT

The present invention provides a package cushioning structure for module, which includes a cushioning bottom board and a cushioning band extending through and interlaced with the cushioning bottom board. The cushioning bottom board forms a plurality of spaced hollow sections. A bar is arranged between every two of the hollow sections. The cushioning band includes a plurality of cushioning air columns mounted thereto at interval. The cushioning air columns are arranged alternately on the bars. To package, modules are each positioned on and born by each of the bars between two of the cushioning air columns. An alternate package cushioning structure includes a cushioning bottom board having a surface forming slots and a cushioning band arranged in the cushioning bottom board through a mounting channel extending through the bottom board from a side surface thereof. Air columns of the cushioning band are located in the slots to support modules.

10 Claims, 5 Drawing Sheets

(56) References Cited

U.S. PATENT DOCUMENTS

| | | | | |
|---|---|---|---|---|
| 4,033,597 | A * | 7/1977 | Boyer | 280/46 |
| 4,065,116 | A * | 12/1977 | Lindenberg et al. | 269/22 |
| 4,202,452 | A * | 5/1980 | McCormick | 211/41.14 |
| 4,465,188 | A * | 8/1984 | Soroka et al. | 206/522 |
| 4,569,082 | A * | 2/1986 | Ainsworth et al. | 383/3 |
| 4,620,633 | A * | 11/1986 | Lookholder | 206/523 |
| 4,905,835 | A * | 3/1990 | Pivert et al. | 206/522 |
| 4,993,559 | A * | 2/1991 | Cota | 211/41.18 |
| 5,042,663 | A * | 8/1991 | Heinrich | 206/522 |
| 5,101,976 | A * | 4/1992 | Salisbury | 206/454 |
| 5,184,727 | A * | 2/1993 | Dickie et al. | 206/522 |
| 5,348,157 | A * | 9/1994 | Pozzo | 206/522 |
| 5,397,000 | A * | 3/1995 | Holte et al. | 206/545 |
| 5,427,830 | A * | 6/1995 | Pharo | 428/35.2 |
| 5,622,262 | A * | 4/1997 | Sadow | 206/522 |
| 5,624,035 | A * | 4/1997 | Kim | 206/522 |
| 5,692,607 | A * | 12/1997 | Brosmith et al. | 206/308.1 |
| 5,755,329 | A * | 5/1998 | Sadow | 206/522 |
| 5,826,723 | A * | 10/1998 | Jaszai | 206/522 |
| H001762 | H | 12/1998 | Kaempf et al. | 206/710 |
| 5,996,798 | A * | 12/1999 | Gessert | 206/521 |
| 6,334,534 | B1 * | 1/2002 | Hollingsworth et al. | 206/320 |
| 6,375,009 | B1 * | 4/2002 | Lee | 206/522 |
| 6,520,332 | B1 * | 2/2003 | Barmore et al. | 206/522 |
| 6,588,605 | B1 * | 7/2003 | Volkert et al. | 211/41.14 |
| 6,629,777 | B2 * | 10/2003 | Tanaka et al. | 383/3 |
| 6,722,502 | B1 * | 4/2004 | Newman | 206/586 |
| 6,755,568 | B2 * | 6/2004 | Malone et al. | 383/3 |
| 6,811,028 | B2 * | 11/2004 | Kim et al. | 206/587 |
| 6,952,910 | B1 * | 10/2005 | Lorsch | 53/472 |
| D512,219 | S * | 12/2005 | Yeo | D3/276 |
| 6,997,318 | B2 * | 2/2006 | Park | 206/454 |
| 7,254,932 | B2 * | 8/2007 | Tanaka et al. | 53/472 |
| 7,297,387 | B2 * | 11/2007 | Koyanagi | 428/166 |
| 7,341,151 | B2 * | 3/2008 | Takagi | 206/454 |
| 7,374,044 | B2 * | 5/2008 | Ting | 206/454 |
| 7,533,772 | B2 * | 5/2009 | Yoshifusa et al. | 206/522 |
| 7,588,148 | B2 * | 9/2009 | Yang | 206/523 |
| 7,681,376 | B2 * | 3/2010 | Hirata et al. | 53/449 |
| 7,726,484 | B2 * | 6/2010 | Komatsu et al. | 206/522 |
| 7,770,731 | B2 * | 8/2010 | Jian | 206/522 |
| 7,815,056 | B2 * | 10/2010 | Coppola et al. | 211/41.14 |
| 7,882,954 | B2 * | 2/2011 | Davlin et al. | 206/522 |
| 7,992,713 | B1 * | 8/2011 | Nelson et al. | 206/522 |
| 8,210,352 | B2 * | 7/2012 | Liao et al. | 206/522 |
| 8,366,594 | B2 * | 2/2013 | Zhang et al. | 493/189 |
| 8,568,029 | B2 * | 10/2013 | Kannankeril et al. | 383/3 |
| 2002/0148744 | A1 * | 10/2002 | Hsu | 206/320 |
| 2003/0015448 | A1 * | 1/2003 | Weder | 206/423 |
| 2004/0149618 | A1 * | 8/2004 | Otaki et al. | 206/521 |
| 2005/0173294 | A1 * | 8/2005 | Chen et al. | 206/593 |
| 2005/0189253 | A1 * | 9/2005 | Huang | 206/454 |
| 2007/0012591 | A1 * | 1/2007 | Igarashi | 206/522 |
| 2007/0131574 | A1 * | 6/2007 | Aoki | 206/454 |
| 2007/0172326 | A1 * | 7/2007 | Sperry et al. | 410/119 |
| 2007/0246394 | A1 * | 10/2007 | Yoshifusa | 206/522 |
| 2007/0278130 | A1 * | 12/2007 | Tschantz | 206/594 |
| 2008/0073238 | A1 * | 3/2008 | Liao et al. | 206/522 |
| 2008/0095474 | A1 * | 4/2008 | Liao et al. | 383/3 |
| 2008/0107362 | A1 * | 5/2008 | Yoshifusa | 383/3 |
| 2008/0164173 | A1 * | 7/2008 | Savakus | 206/454 |
| 2009/0050510 | A1 * | 2/2009 | Kojima et al. | 206/522 |
| 2009/0283436 | A1 * | 11/2009 | Carcamo et al. | 206/522 |
| 2009/0324358 | A1 * | 12/2009 | Ramirez | 410/119 |
| 2010/0032336 | A1 * | 2/2010 | Yokoyama et al. | 206/522 |
| 2010/0072103 | A1 * | 3/2010 | Watanabe et al. | 206/522 |
| 2010/0147712 | A1 * | 6/2010 | Filho et al. | 206/315.1 |
| 2010/0316461 | A1 * | 12/2010 | Huchler | 410/119 |
| 2012/0247071 | A1 * | 10/2012 | Bridges et al. | 53/472 |
| 2012/0269594 | A1 * | 10/2012 | Starnes | 410/119 |
| 2013/0091809 | A1 * | 4/2013 | Shi | 53/475 |
| 2013/0270134 | A1 * | 10/2013 | Chen et al. | 206/320 |
| 2013/0334082 | A1 * | 12/2013 | Zhao et al. | 206/316.1 |
| 2013/0343069 | A1 * | 12/2013 | Kuo et al. | 362/396 |

FOREIGN PATENT DOCUMENTS

| | | |
|---|---|---|
| JP | 2011-16560 A | 1/2011 |
| WO | WO2008/119818 A1 | 10/2008 |

* cited by examiner

PACKAGE CUSHIONING STRUCTURE FOR MODULE

BACKGROUND OF THE INVENTION

1. Field of the Invention

The present invention relates to the field of packaging material, and in particular to a package cushioning structure for module.

2. The Related Arts

In the field of manufacture of liquid crystal display devices, the manufacture of liquid crystal display devices includes a process of assembling, which assembles various components, including a liquid crystal module, a backlight module, a main control circuit, and an enclosure, together. These components are each manufactured in advance and packaged for being later assembled to form a complete liquid crystal display device. The liquid crystal module or the backlight module, after being manufactured, are packaged in a package box that is filed with cushioning materials and then shipped to a corresponding assembling station in box. It is inevitable that the liquid crystal module or the backlight module will be subjected to impact or shock during the process of transportation. Cushioning packaging functions to protect products from mechanical damages caused by external forces in product logistics, such as transportation. Package cushioning materials are classified in two types, namely plastic cushioning material and pulp cushioning material.

The modules are often packaged with expandable polyethylene (EPE), expandable polystyrene (EPS), or pulp for cushioning. However, conventional module cushioning structure (as shown in FIG. 1) is entirely made of EPE, EPS, or pulp. This consumes a relatively amount of EPE, EPS or pulp and makes the cost high.

SUMMARY OF THE INVENTION

An object of the present invention is to provide a package cushioning structure for module, which comprises a cushioning bottom board to which a cushioning band is mounted and comprising cushioning air columns that are economic to provide cushioning thereby effectively lowering down the cost of packaging.

To achieve the object, the present invention provides a package cushioning structure for module, which comprises a cushioning bottom board and a cushioning band extending through and interlaced with the cushioning bottom board. The cushioning bottom board forms a plurality of spaced hollow sections. A bar is arranged between every two of the hollow sections. The cushioning band comprises a plurality of cushioning air columns mounted thereto at interval. The cushioning air columns are arranged alternately on the bars, whereby to package, modules are each positioned on and born by each of the bars between two of the cushioning air columns.

The cushioning bottom board is made of expandable polyethylene, expandable polystyrene, or pulp.

Each of the cushioning air columns comprises an air-filling hole and a closure device for closing the air-filling hole.

The cushioning band is alternately set through the hollow sections of the cushioning bottom board in such a way that the cushioning air columns are alternately located on the bars.

The modules comprise liquid crystal modules or backlight modules.

The present invention also provides a package cushioning structure for module, which comprises a cushioning bottom board and a cushioning band arranged in the cushioning bottom board. The cushioning bottom board has a top surface forming a plurality of spaced slots. A mounting channel is formed to extend through cushioning bottom board from a side surface of the cushioning bottom board that is parallel to the slots. The slots are in communication with the mounting channel. The cushioning band comprises a plurality of cushioning air columns mounted thereto at interval. The cushioning band is received and retained in the mounting channel in such a way that the cushioning air columns of the cushioning band are located in the slots, whereby to package, modules are respectively disposed in the slots and born by the cushioning air columns.

The cushioning bottom board is made of expandable polyethylene, expandable polystyrene, or pulp.

Each of the cushioning air columns comprises an air-filling hole and a closure device for closing the air-filling hole.

The modules comprise liquid crystal modules or backlight modules.

The present invention also provides a package cushioning structure for module, which comprises a cushioning bottom board and a cushioning band extending through and interlaced with the cushioning bottom board, the cushioning bottom board forming a plurality of spaced hollow sections, a bar being arranged between every two of the hollow sections, the cushioning band comprising a plurality of cushioning air columns mounted thereto at interval, the cushioning air columns being arranged alternately on the bars, whereby to package, modules are each positioned on and born by each of the bars between two of the cushioning air columns;

wherein the cushioning bottom board is made of expandable polyethylene, expandable polystyrene, or pulp;

wherein each of the cushioning air columns comprises an air-filling hole and a closure device for closing the air-filling hole;

wherein the cushioning band is alternately set through the hollow sections of the cushioning bottom board in such a way that the cushioning air columns are alternately located on the bars; and wherein the modules comprise liquid crystal modules or backlight modules.

The efficacy of the present invention is that the present invention provides a package cushioning structure for module, which comprises a cushioning bottom board to which a cushioning band is mounted to provide an improved cushioning effect. Cushioning air columns that are economic are used as cushioning. Before inflation, the cushioning air columns are in the form of a thin film, occupying a small amount of storage space, so as to effectively reduce the material cost and storage cost and thus reduce the packaging cost.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
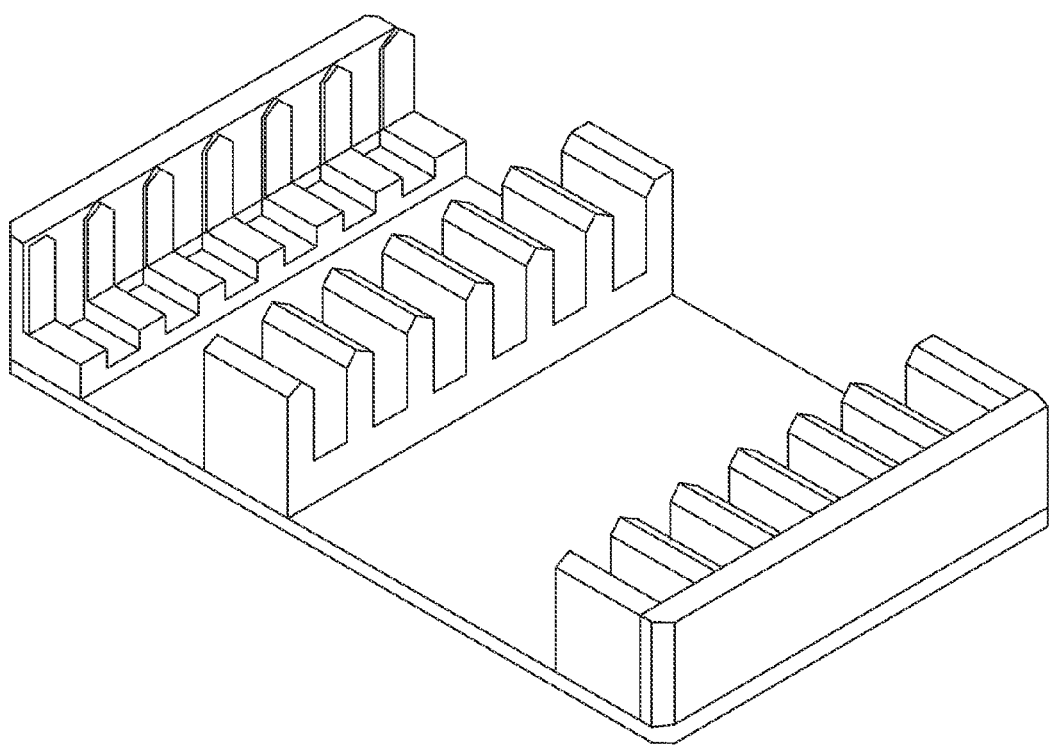
FIG. 1 is a schematic view showing a conventional package cushioning structure for module.
Figure 2:
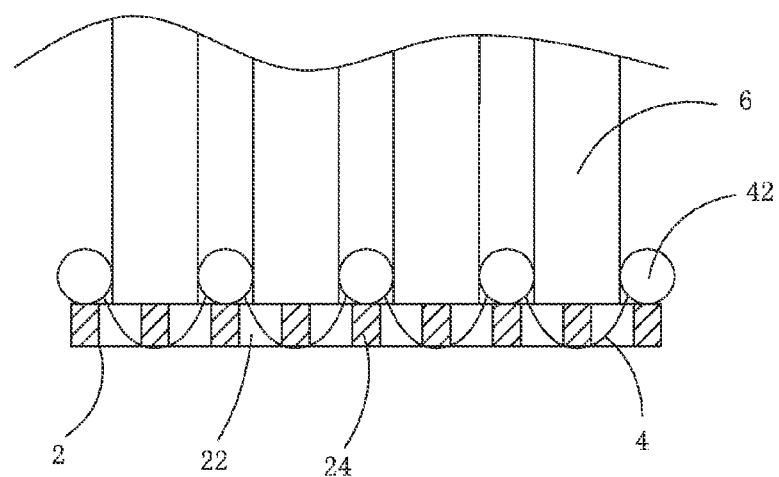
FIG. 2 is a schematic view showing the structure of a package cushioning structure for module according to a first embodiment of the present invention.
Figure 3:
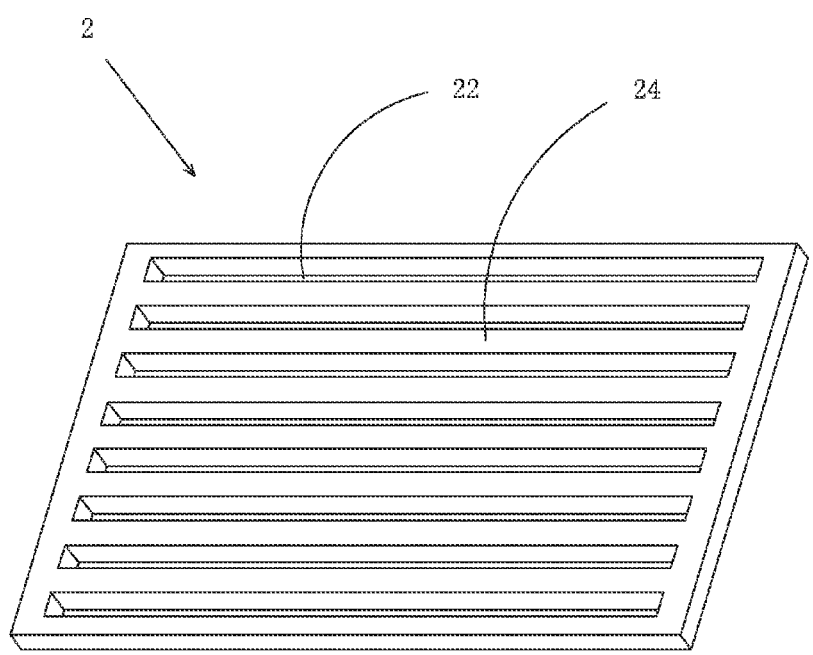
FIG. 3 is a perspective view showing a cushioning bottom board of FIG. 2.

Referring to FIGS. 2 and 3, a first embodiment of the present invention provides a package cushioning structure for module, which comprises a cushioning bottom board 2 and a cushioning band 4 extending through and interlaced with the cushioning bottom board 2. The cushioning bottom board 2 forms a plurality of spaced hollow sections 22. A bar 24 is arranged between every two hollow sections 22. The cushioning band 4 comprises a plurality of cushioning air columns 42 mounted thereto at interval. The cushioning air columns 42 are arranged alternately on the bars 24. To package, modules 6 are each positioned on and born by each bar 24 between two cushioning air columns 42.

The cushioning bottom board 2 can be made of expandable polyethylene (EPE), expandable polystyrene (EPS), or pulp. These materials are light and low cost.

Each of the cushioning air columns 42 is provided with an air-filling hole (not shown) and a closure device for closing the air-filling hole (not shown). Before inflation, the cushioning air columns 42 are generally in the form of a film, making them occupying almost no space and easy to transport.

To package, the cushioning band 4 is alternately set through the hollow sections 22 in such a way that the film-like cushioning air columns 42 are alternately located on the bars 24. Air is then filled into the cushioning air columns 42. The package cushioning structure of the instant embodiment is entirely disposed in a package box (not shown). Afterwards, modules 6 are each positioned between two cushioning air columns 42 to be supported by the bar 24. With the bars 24 supporting the modules 6 and the cushioning air columns 42 sandwiching the modules 6, an improved effect of cushioning can be realized.

In the instant embodiment, the modules 6 can be liquid crystal modules or backlight modules.

Figure 4:
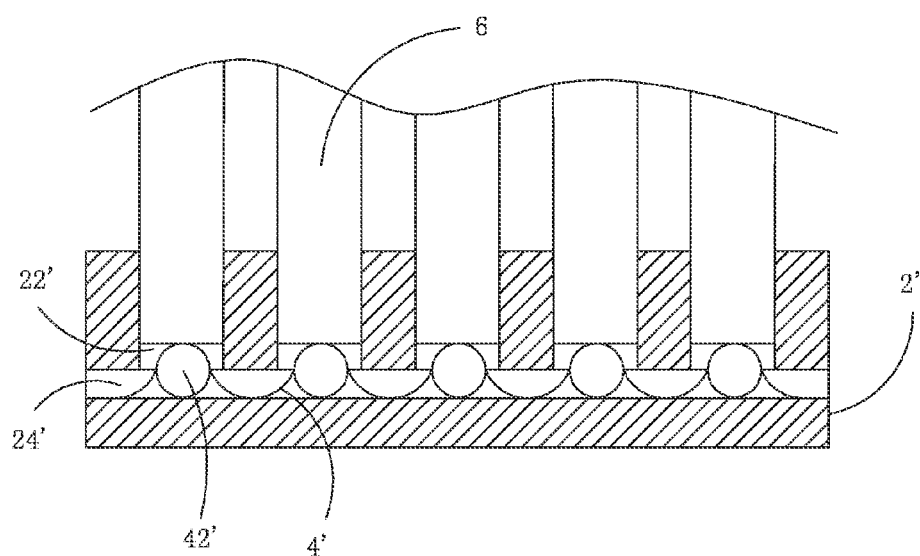
FIG. 4 is a schematic view showing the structure of a module packaging device according to a second embodiment of the present invention.
Figure 5:
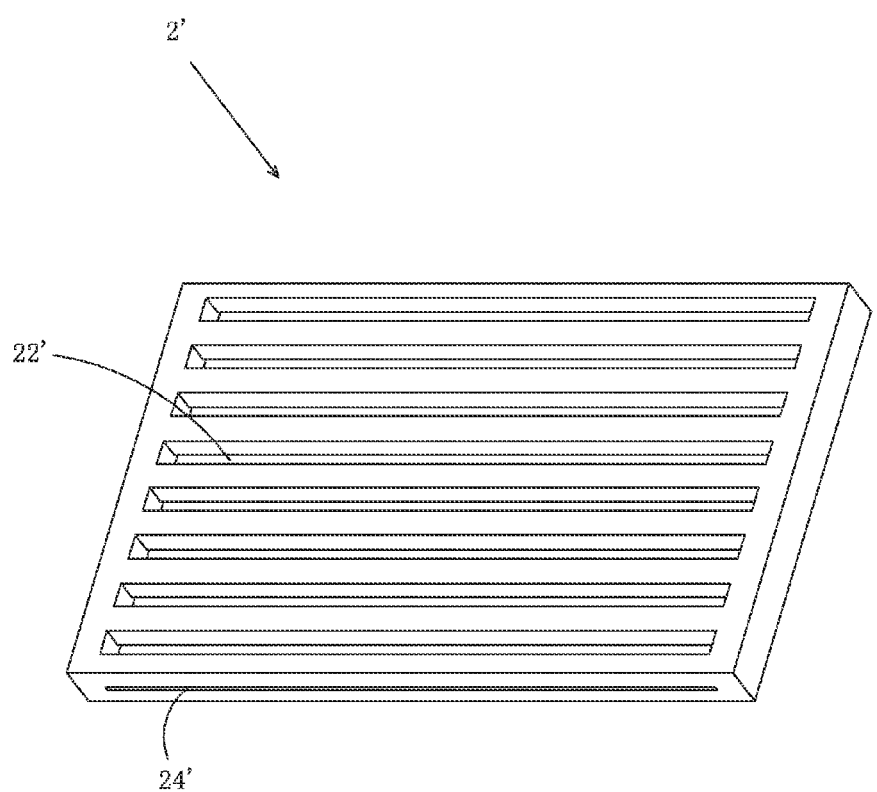
FIG. 5 is a perspective view showing a cushioning bottom board of FIG. 4.

Referring to FIGS. 4 and 5, the present invention also provides a package cushioning structure for module, which comprises a cushioning bottom board 2' and a cushioning band 4' arranged in the cushioning bottom board 2'. The cushioning bottom board 2' has a top surface forming a plurality of spaced slots 22'. A mounting channel 24' is formed to extend through the cushioning bottom board 2' from a side surface of the cushioning bottom board 2' that is parallel to the slots 22'. The slots 22' are in communication with the mounting channel 24'. The cushioning band 4' comprises a plurality of cushioning air columns 42' mounted thereto at interval. The cushioning band 4' is received and retained in the mounting channel 24' in such a way that the cushioning air columns 42' of the cushioning band 4' are located in the slots 22'. To package, modules 6 are respectively disposed in the slots 22' and born by the cushioning air columns 42'.

The cushioning bottom board 2' can be made of EPE, EPS, or pulp. These materials are light and low cost.

Each of the cushioning air columns 42' is provided with an air-filling hole (not shown) and a closure device for closing the air-filling hole (not shown). Before inflation, the cushioning air columns 42' are generally in the form of a film, making them occupying a very tiny amount of storage space.

To package, the cushioning band 4' is first set into the mounting channel 24'. Then, air is filled into the cushioning air columns 42' are the cushioning air columns 42' are set in the slots 22'. The package cushioning structure of the instant embodiment is entirely disposed in a package box (not shown). Afterwards, modules 6 are respectively disposed in the slots 22'. With the cushioning air columns 42' bearing the modules 6, an improved effect of cushioning can be realized.

In the instant embodiment, the modules 6 can be liquid crystal modules or backlight modules.

In summary, the present invention provides a package cushioning structure for module, which comprises a cushioning bottom board to which a cushioning band is mounted to provide an improved cushioning effect. Cushioning air columns that are economic are used as cushioning. Before inflation, the cushioning air columns are in the form of a thin film, occupying a small amount of storage space, so as to effectively reduce the material cost and storage cost and thus reduce the packaging cost.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A package cushioning structure for module, comprising a cushioning bottom board and a cushioning band extending through and interlaced with the cushioning bottom board, the cushioning bottom board forming a plurality of spaced hollow sections, a bar being arranged between every two of the hollow sections, the cushioning band comprising a plurality of cushioning air columns mounted thereto at interval, the cushioning air columns being arranged alternately on the bars, whereby to package, modules are each positioned on and born by each of the bars between two of the cushioning air columns.

2. The package cushioning structure for module as claimed in claim 1, wherein the cushioning bottom board is made of expandable polyethylene, expandable polystyrene, or pulp.

3. The package cushioning structure for module as claimed in claim 1, wherein each of the cushioning air columns comprises an air-filling hole and a closure device for closing the air-filling hole.

4. The package cushioning structure for module as claimed in claim 1, wherein the cushioning band is alternately set through the hollow sections of the cushioning bottom board in such a way that the cushioning air columns are alternately located on the bars.

5. The package cushioning structure for module as claimed in claim 1, wherein the modules comprise liquid crystal modules or backlight modules.

6. A package cushioning structure for module, comprising a cushioning bottom board and a cushioning band arranged in the cushioning bottom board, the cushioning bottom board having a top surface forming a plurality of spaced slots, a mounting channel being formed to extend through cushioning bottom board from a side surface of the cushioning bottom board that is parallel to the slots, the slots being in communication with the mounting channel, the cushioning band comprising a plurality of cushioning air columns mounted thereto at interval, the cushioning band being received and retained in the mounting channel in such a way that the cushioning air columns of the cushioning band are located in the slots, whereby to package, modules are respectively disposed in the slots and born by the cushioning air columns.

7. The package cushioning structure for module as claimed in claim 6, wherein the cushioning bottom board is made of expandable polyethylene, expandable polystyrene, or pulp.

8. The package cushioning structure for module as claimed in claim 6, wherein each of the cushioning air columns comprises an air-filling hole and a closure device for closing the air-filling hole.

9. The package cushioning structure for module as claimed in claim 6, wherein the modules comprise liquid crystal modules or backlight modules.

10. A package cushioning structure for module, comprising a cushioning bottom board and a cushioning band extending through and interlaced with the cushioning bottom board, the cushioning bottom board forming a plurality of spaced hollow sections, a bar being arranged between every two of the hollow sections, the cushioning band comprising a plurality of cushioning air columns mounted thereto at interval, the cushioning air columns being arranged alternately on the bars, whereby to package, modules are each positioned on and born by each of the bars between two of the cushioning air columns;

wherein the cushioning bottom board is made of expandable polyethylene, expandable polystyrene, or pulp;

wherein each of the cushioning air columns comprises an air-filling hole and a closure device for closing the air-filling hole;

wherein the cushioning band is alternately set through the hollow sections of the cushioning bottom board in such a way that the cushioning air columns are alternately located on the bars; and wherein the modules comprise liquid crystal modules or backlight modules.

* * * * *